252-95

EXAMINER

United States Patent Office 3,383,319
Patented May 14, 1968

3,383,319
CLEANING OF SEMICONDUCTOR DEVICES
James R. Black, Phoenix, Ariz., assignor to Motorola, Inc., Franklin Park, Ill., a corporation of Illinois
No Drawing. Filed Oct. 22, 1965, Ser. No. 502,316
7 Claims. (Cl. 252—95)

ABSTRACT OF THE DISCLOSURE

Contaminants are removed from glass surfaces of semiconductor devices by treatment with an aqueous solution of hydrogen peroxide containing an ionic promoter to accelerate the action of the peroxide. Preferred conditions include a peroxide composition between about 5% and 50% by volume, a promoter concentration between about 0.01% and 5% by weight, and a temperature of at least about 90° C.

This invention relates to a novel method of producing semiconductor devices of high quality and more particularly relates to a new and improved method of removing contaminants from semiconductor devices having metal contacts, leads, connections, etc.

One of the problems heretofore encountered in the production of glass passivated semiconductor devices has been the difficulties in obtaining glass films of a high degree of purity and maintaining such purity during the fabrication of the devices. Contaminants are present in and on the glass, with the result that the electrical characteristics and performance of the devices are adversely affected. This contamination may cause high reverse leakage currents, poor breakdown voltages, device instability, etc.

Contamination is of particular significance when organic materials such as photoresist compositions are employed in the fabrication of devices. The photoresist composition is generally applied over a surface of a wafer, and then a pattern having a large number of repeated representations is exposed onto the resist coated surface causing the exposed portion of the coating to harden and the unexposed portion to remain in a soluble condition. The soluble portions are removed such as by washing with a solvent, to form a mask with a desired pattern of openings in the hardened resist coating.

Before the desired processing, for example, diffusion, epitaxial growth and/or metallization is performed, the hardened resist coating is removed using a suitable solvent. Sometimes the resist is not completely removed, so that subsequent processing steps at elevated temperatures cause breakdown of the resist composition releasing contaminants which deleteriously affect the performance of the completed devices.

Attempts have been made to provide better removal of the resist composition through the use of more powerful solvents and more severe cleaning conditions, but these expedients have not proved completely successful since they have only reduced the contamination slightly.

While hydrogen peroxide solutions with ammonia have been employed to remove contaminants from glass surfaces, a problem is created in the cleaning of thin glass films with exposed metal portions since the alkaline peroxide attacks many metals at the same time that it removes contaminants from the glass. Thus, it has not been possible to clean glass surfaces having exposed aluminum metal with alkaline hydrogen peroxide solutions because of the corrosive action thereof.

An object of the present invention is to provide a novel method for producing semiconductor devices of uniformly high quality.

Another object of the invention is to provide a novel method for improving the purity of glass films on semiconductor devices having exposed metal portions.

A further object of the invention is to provide a method for removing contaminants from passivating glass films employed in the fabrication of semiconductor devices having thin metal films.

A feature of the present invention is a novel method for removing contaminants from glass films of semiconductor devices having exposed metal portions by treating the devices with an aqueous solution comprising hydrogen peroxide and an ionizable metal compound.

The present invention is embodied in a method for removing contaminants from glass films or semiconductor devices having exposed metal portions, including the step of subjecting the glass surface of the device to an aqueous solution comprising hydrogen peroxide and an ionizable metal compound at a temperature above about 90° C.

The semiconductor devices treated in accordance with the method of the present invention are generally fabricated from semiconductor materials such as a single crystal element of silicon or germanium although various semiconductor compounds also may be employed. The crystal amount is advantageously a wafer which is typically obtained from a larger crystal grown by known crystal pulling or zone melting processes. The larger crystal is sliced into wafers and the wafers lapped, polished and otherwise processed to make their major faces substantially parallel to each other. The cross-sectional dimension of the wafers may be of any value and the thickness can be within a practical range, e.g., about 4 to 40 mills.

The wafers may be processed by conventional methods including epitaxial growth, diffusion, alloying, etc. After the desired regions and junctions have been formed in the wafers, such as by diffusion, epitaxial growth, alloying, etc., a passivating glass film is formed over the surface of the wafers such as by the deposition or formation of a thin refractory oxide film, e.g., a noxide of silicon, aluminum, boron, mixtures thereof, etc.

After the glass film has been formed on the surface, openings are formed in the film exposing selected regions of wafer surface. The exposed portions may be metallized to connect the desired regions of each device and provide leads or connections for the fabrication into a circuit.

In accordance with the invention, the resulting glassed and metallized devices are treated with an aqueous solution of hydrogen peroxide and the ionizable metal compound at a temperature above about 90° C. Advantageously, the proportion of hydrogen peroxide in the aqueous solution is between about 5% and 50% by volume and that of the metal compound between about 0.01% and 5% by weight.

The hydrogen peroxide is employed in an unstabilized form so that the metal compound combined therewith can promote the decomposition thereof. The ionizable metal compound is advantageously a water-soluble salt of a metal which forms a water-soluble hydroxide with the hydrogen peroxide and does not form any precipitates or colloids. For example, a compound of a metal such as osmium, manganese, cobalt, molybdenum, copper, etc., may be employed. Cobalt compounds are particularly useful.

The water used in formulating the aqueous solution employed in the method of the present invention advantageously is very pure and preferably a degreased and deionized water. The solution is advantageously formed by mixing hydrogen peroxide with a portion of the water in approximately equal parts by volume to form one component and dissolving a small amount of the metal compound in water to form the second component. The hydrogen peroxide solution and the metal compound solution preferably mixed immediately prior to use and the resulting solution heated to a temperature above about 90° C. and preferably between about 95° and 100° C.

The pH of the aqueous solution is advantageously less than about seven, and preferably between about 6 and 7. Increasing the pH above seven causes the solution to decompose at a near explosive rate.

The wafers after being glassed and metallized either before or after die or wire bonding, are advantageously cleaned in accordance with the method of the present invention by immersing the wafers in a bath containing the cleaning solution. The cleanness of the wafers may be judged to a degree by the position of the wafers in the solution. Generally, the wafers float on the surface of the bath until substantially all of the contaminants have been removed from the wafers, after which the wafers sink to the bottom of the bath. When no apparent bubbles are observable forming on the surface of the wafers, the wafers are judged clean. This change in position takes place at a time depending upon the initial state of contamination of the wafers and may require approximately 15 to 30 minutes of treatment in a boiling (above about 98° C.) cleaning solution. Advantageously, the wafers are maintained in the initial solution for an additional period equivalent to the original cleaning, i.e., a total time of up to about 60 minutes, to insure that a high degree of purity is achieved.

The following examples illustrate specific embodiments of the invention, although it is not intended that the examples restrict the scope of the invention.

Example I

Equal parts by volume of deionized and degreased water and a 30% by volume solution of electronic grade non-stabilized hydrogen peroxide were mixed. A second solution was prepared by mixing eight parts by weight of cobaltous nitrate hexahydrate with 100 parts of deionized and degreased water. Thereafter, about 4 parts by volume of the cobaltous nitrate solution were mixed with 100 parts of the hydrogen peroxide solution. The pH of the solution was about 7. The wafers to be cleaned were placed into a beaker containing the above mixture, and the bath was heated to a temperature of about 100° C. for a period of about 15 minutes. The wafers floated when first placed in the solution. Also, bubbles formed over the surface of the wafers. As the heating period continued, the wafers moved to the bottom of the beaker and stood on edge with bubbles adhering to the surface. Further heating reduced the number of bubbles adhering to the surface and the wafers lay flat in the bottom of the beaker. After heating for about 15 minutes, the bubbles disappeared. To insure that the wafers had been properly cleaned, the heating was continued for an additional 15 minutes.

Degreased and deionized water was added to the bath so that the bath overflowed the container. The overflow rinsing cleaned the surface of the bath so that the wafers did not become contaminated as they were removed from the bath. The cleaned wafers were then dried by blowing clean, warm air over the wafers. The air was charcoal filtered and micropore filtered prior to being passed over the wafers.

The wafers were examined under a 50 power microscope and were found to have clean, bright surfaces. The exposed aluminum metal portions appeared to be unchanged from the original wafers with no sign of attack by the cleaning solution.

The cleanness of the wafers was tested by the following procedure. The wafer was immersed in degreased, deionized water. Upon removal from the water, the adhering liquid formed a smooth film which remained intact for about 3 minutes, indicating that less than one monolayer of contaminants was present on the surface of the wafer. To determine whether the contaminants were less than 0.1 monolayer in thickness, a fine mist of clean water was formed onto a cooled surface by condensation from a moist ambient. The water droplets wetted the surface and flowed together forming a continuous film which is black in appearance. This provides an approximation that less than 0.1 monolayer of hydrophobic contaminants is present. If more than 0.1 monolayer is present, the fine water droplets settle onto the surface of the wafer in the form of minute spheres which appear as a haze or fog under grazing light. Also, the fine droplets can be formed by an operator breathing onto the surface of wafer which is being observed under a microscope by blowing through a small tube held close to the surface of the wafer.

Devices made from the above wafers showed near theoretical junctions with low reverse leakage current and high breakdown voltage with no walk-out. Transistors made from the above wafers approached theoretical beta.

Example II

The procedure of this example was the same as that of Example I except that about 40 parts by volume of the cobaltous nitrate soltuion were mixed with 100 parts of the hydrogen peroxide solution to form a solution having a pH of about 7.

The cleaned wafers were tested according to the procedure of Example I and were found to have less than 0.1 monolayer of contaminants on the surface thereof. Devices made from the above cleaned wafers showed the same high quality and superior performance as devices of Example I.

Example III

The procedure of this example was the same as that of Example I except that an aqueous solution of chromium sulfate was employed in place of the cobaltous nitrate solution. Devices made from the above cleaned wafers showed the same high quality and superior performance as devices of Example I.

Example IV

The procedure of this example was the same as that of Example I except that the temperature of the solution was about 95° C., and the concentration of the cobaltous nitrate solution was changed to about 10 parts by volume per 100 parts of the hydrogen peroxide solution. Devices made from the above cleaned wafers showed the same high quality and superior performance as devices of Example I.

The above description and examples show that the present invention provides an improved and novel method for removing contaminants from semiconductor devices having exposed metal portions. Moreover, the method provides improved removal of contaminants for passivating glass films employed in the fabrication of the semiconductor devices having thin metal films. Also, the method of the present invention may be used for the removal of contaminants either before or after die bonding or wire bonding.

I claim:

1. A method for removing contaminants from a glass film on a semiconductor device having exposed metal portions, including the step of subjecting said glass film to an aqueous solution comprising between about 5% and 50% hydrogen peroxide by volume, and between about 0.01% and 5% by weight of a water soluble salt of a metal selected from the group consisting of osmium, manganese, cobalt, molybdenum, and copper at a temperature above about 90° C.

2. A method according to claim 1 in which the cobalt salt is cobaltous nitrate.

3. A method according to claim 1 in which the pH of the aqueous solution is less than about seven.

4. A method according to claim 1 in which the temperature is maintained between about 90° and 100° C.

5. A method for removing contaminants from glass films on semiconductor devices having metal contacts, leads, etc., including the steps of forming a solution of hydrogen peroxide in degreased, deionized water, forming a solution of cobaltous nitrate in degreased and deionized water, adding sufficient cobaltous nitrate solution to said hydrogen peroxide solution to form an aqueous solution containing between about 5% and 50% by volume of hydrogen peroxide and between 0.01% and 5% by weight of cobaltous nitrate and having a pH less than about 7, subjecting a plurality of semiconductor devices having passivating glass films and exposed metal portions to said aqueous solution while maintaining the temperature thereof between about 95° and 100° C.

6. A method according to claim 5 in which said devices are immersed in said aqueous solution for between about 15 and 60 minutes.

7. A method for removing contaminants from a glass film on a semiconductor device having exposed metal portions, including the step of subjecting said glass film to an aqueous solution of about 5% to 50% hydrogen peroxide by volume and about 0.01% to 5% by weight of a water soluble salt of a metal selected from the group consisting of osmium, manganese, cobalt, molybdenum, and copper at a temperature above about 90° C.

References Cited

UNITED STATES PATENTS

| | | | |
|---|---|---|---|
| 2,974,075 | 3/1961 | Miller | 156—17 XR |
| 3,103,733 | 9/1963 | Favro et al. | 156—17 |
| 3,156,654 | 11/1964 | Konecny et al. | 252—99 |
| 3,211,658 | 10/1965 | Hirtz et al. | 252—89 XR |

LEON D. ROSDOL, *Primary Examiner.*

M. WEINBLATT, *Assistant Examiner.*